United States Patent

Annis et al.

[11] Patent Number: 5,130,700
[45] Date of Patent: Jul. 14, 1992

[54] ELECTRONIC TORQUE WRENCH AND OVERSHOOT COMPENSATION CIRCUIT THEREFOR

[75] Inventors: Jeffrey R. Annis, Waukesha; Timm R. Herman, Kenosha; Ronald T. Strobel, South Milwaukee, all of Wis.

[73] Assignee: Snap-on Tools Corporation, Kenosha, Wis.

[21] Appl. No.: 664,117

[22] Filed: Mar. 4, 1991

[51] Int. Cl.⁵ ............... G08B 21/00; B25B 23/144
[52] U.S. Cl. ........................... 340/665; 81/479; 340/407; 364/508
[58] Field of Search ........ 340/665, 680, 407, 660-661, 340/691; 81/479; 173/12; 73/862.23, 862.24; 364/508

[56] References Cited

U.S. PATENT DOCUMENTS

| | | | |
|---|---|---|---|
| 4,023,406 | 5/1977 | Benz, Jr. | 73/862.24 |
| 4,125,016 | 11/1978 | Lehoczky et al. | 73/862.23 |
| 4,400,785 | 8/1983 | Wallace et al. | 364/508 |
| 4,516,116 | 5/1985 | White | 340/665 X |
| 4,641,538 | 2/1987 | Heyraud | 73/862.26 |
| 4,669,319 | 6/1987 | Heyraud | 73/862.23 |
| 4,685,050 | 8/1987 | Polzer et al. | 173/12 X |
| 4,797,662 | 1/1989 | Graham et al. | 340/677 |
| 4,802,540 | 2/1989 | Grabovac et al. | 73/862.65 X |
| 4,831,365 | 5/1989 | Thomas et al. | 340/680 |
| 4,881,435 | 11/1989 | Hansson | 173/12 X |
| 4,947,341 | 8/1990 | Shine | 364/508 |
| 4,958,541 | 9/1990 | Annis et al. | 81/479 |

FOREIGN PATENT DOCUMENTS 3324333  1/1985  Fed. Rep. of Germany ........ 81/479

Primary Examiner—Donnie L. Crosland
Assistant Examiner—Thomas J. Mullen, Jr.
Attorney, Agent, or Firm—Emrich & Dithmar

[57] ABSTRACT

A torque wrench has a battery-powered sensing circuit which produces a torque signal proportional to the level of the torque applied. A reference signal corresponding to a predetermined torque level is subtracted from the torque signal to produce a difference signal which is, in turn, compared with a compensation signal which is proportional to the rate of change of the torque signal and is produced by differentiating the torque signal. When the value of the difference signal exceeds the value of the compensation signal, an indicator is triggered to produce a tactile indication, the indication being produced prior to the time that the torque signal reaches the reference level by a predetermined time period.

20 Claims, 1 Drawing Sheet

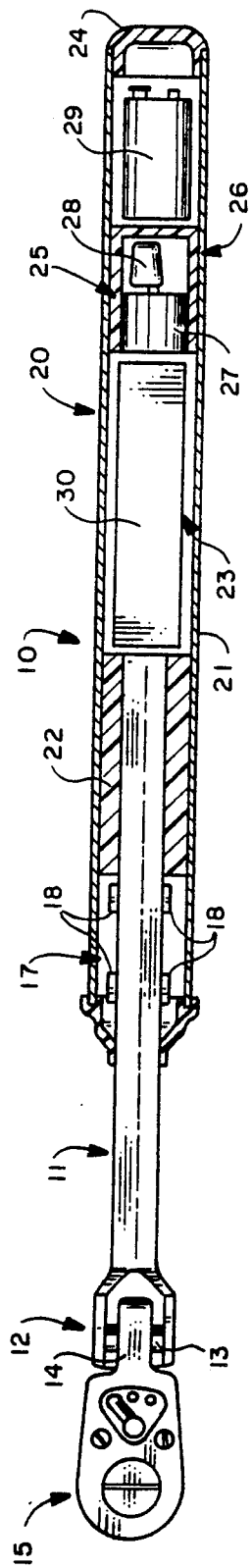
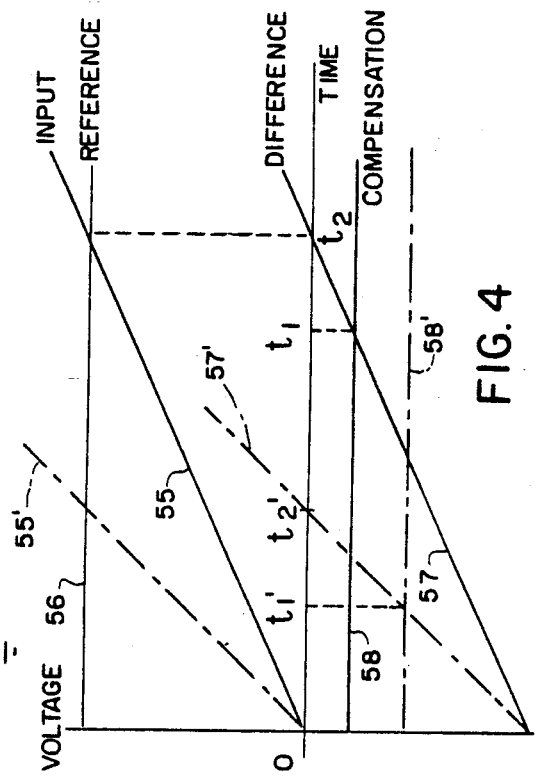
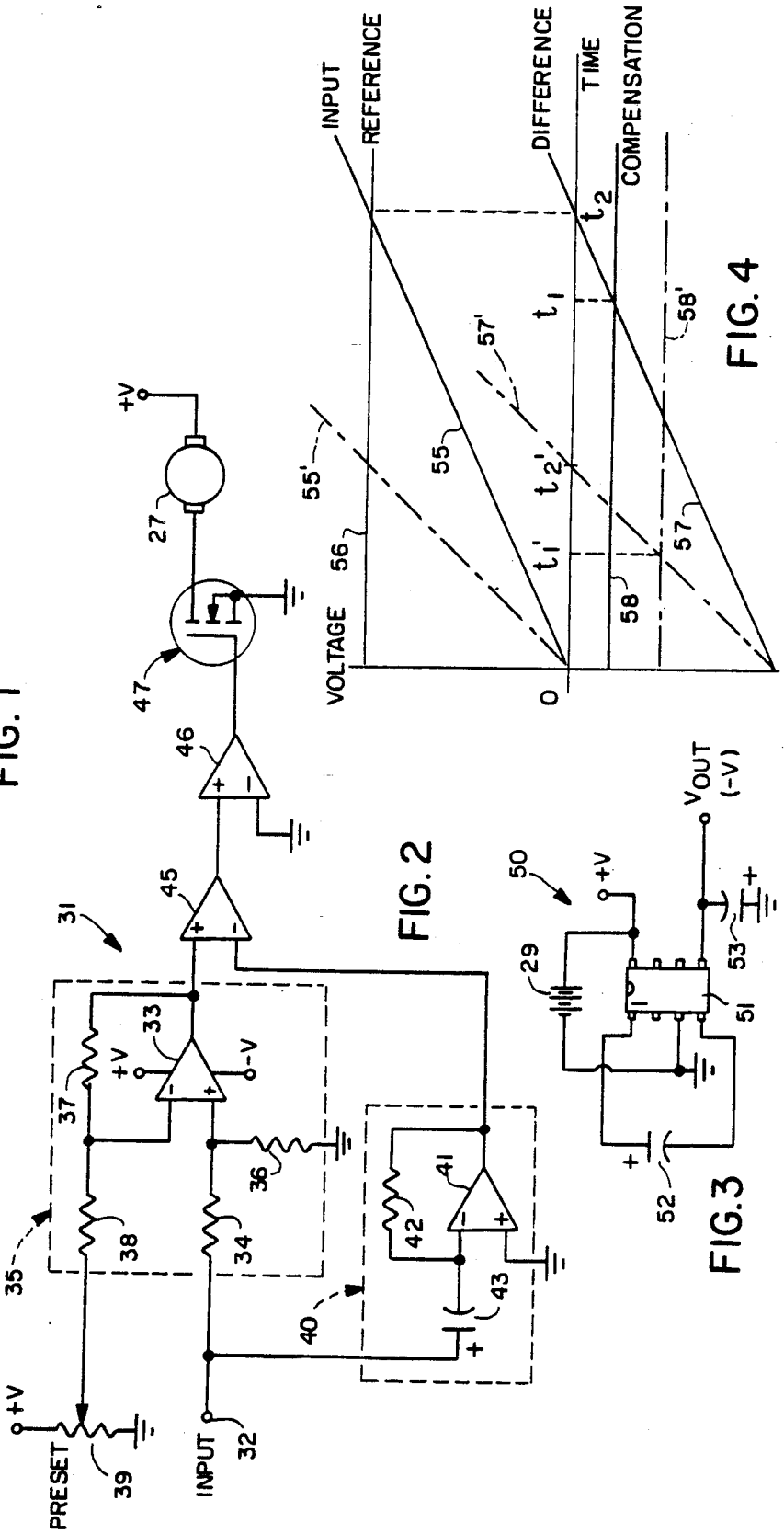

ELECTRONIC TORQUE WRENCH AND OVERSHOOT COMPENSATION CIRCUIT THEREFOR

BACKGROUND OF THE INVENTION

1. Field of the Invention

The present invention relates to torque-applying devices and, in particular, to electronic torque wrenches of the type which have a battery-powered torque-sensing circuit and output indicator means.

2. Description of the Prior Art

A standard electronic torque wrench includes a rigid elongated body having a tool end adapted to be rotationally fixed to a part to which a predetermined torque is to be applied, and a handle end. Transducers including strain gauges connected between the tool end and the body generate an actual-value electrical torque signal corresponding to the actual torque being applied by the wrench to the part rotationally coupled to the tool end. Typically, an output circuit provides to the user an indication of the actual torque value being applied and/or a signal that the applied torque equals the predetermined desired torque level.

Such torque wrenches are subject to inaccuracies in use. In the event the output indication is of the actual torque being applied, the user must very carefully watch the indication to avoid inadvertently going past the desired torque. The user must also exercise great care if the output indication is a signal indicating that the predetermined torque value has been reached. Otherwise, since the user is typically applying considerable force to the handle of the wrench, his reaction time will not permit him to relieve that force quickly enough after the signal to avoid overshooting the predetermined torque level.

It is known to provide a warning indication when the applied torque reaches some fixed threshold level below the predetermined desired torque level to give the user time to decrease the applied force before the predetermined level is reached. But for different users and different applications, the rate at which the torque is applied may vary considerably and a threshold level which is appropriate to provide adequate warning for one torque application rate may be inadequate at a faster torque application rate.

SUMMARY OF THE INVENTION

It is a general object of the present invention to provide an improved electronic torque wrench which avoids the disadvantages of prior wrenches while affording additional structural and operating advantages.

An important feature of the invention is the provision of an overshoot compensation circuit which affords variable compensation to provide a warning signal at a predetermined lead time prior to the time that a time-varying input signal reaches a predetermined level.

In connection with the foregoing feature, another feature of the invention is the provision of a compensation circuit of the type set forth, wherein the signal level at which the warning signal is generated varies as a function of the rate of change of the input signal.

In connection with the foregoing features it is another feature of the invention to provide a compensation circuit of the type set forth, wherein the signal level at which the warning signal is generated is directly proportional to the rate of change of the input signal.

Still another feature of the invention is the provision of a torque wrench incorporating a compensation circuit of the type set forth, which provides a warning signal a predetermined lead time prior to the time a predetermined torque level is reached.

These and other features of the invention are attained by providing an overshoot compensation circuit for providing an output signal before a time-varying input signal reaches a predetermined level, the circuit comprising: means establishing a reference signal corresponding to the predetermined level, means responsive to the input signal for producing a compensation signal which is a function of the rate of change of the input signal, and means responsive to the input signal and the reference signal and the compensation signal for producing the output signal a predetermined time period before the input signal reaches the predetermined level.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 1 is a plan view, in partial section, illustrating an electronic torque wrench incorporating an overshoot compensation circuit, constructed in accordance with and embodying the features of the present invention;

FIG. 2 is a schematic circuit diagram of the overshoot compensation circuit of the wrench of FIG. 1;

FIG. 3 is a schematic circuit diagram of the power supply circuit for the overshoot compensation circuit of FIG. 2; and FIG. 4 is a graph of voltage against time of various signals produced in the circuit of FIG. 2 to illustrate the operation thereof.

DESCRIPTION OF THE PREFERRED EMBODIMENT

Referring to FIG. 1, there is illustrated an electronic torque wrench, generally designated by the numeral 10, which may be of the type disclosed in U.S. Pat. No. 4,958,541 and, therefore, only so much of the construction will be described herein as is necessary for an understanding of the present invention.

The torque wrench 10 includes a flexure member in the form of an elongated deflection beam 11, which is substantially rectangular in transverse cross section. The deflection beam 11 is provided at one end thereof with a yoke 12 which is pivotally coupled by a pivot pin 13 to a tongue 14 of a ratchet head 15. The ratchet head 15 is of standard construction, having a rotatable drive lug (not shown) projecting from the front side thereof. While a ratchet drive is illustrated, the wrench 10 could alternatively be provided with a head having a fixed square drive.

Mounted on the deflection beam 11 is a torque sensing assembly 17, which includes a plurality of strain gauges 18 fixedly secured to the deflection beam 11 in a predetermined configuration. The torque wrench 10 also has a handle assembly 20, which includes an elongated hollow tube 21 substantially rectangular in transverse cross section. One end of the deflection beam 11 is received in one end of the tube 21 and is preferably fixedly secured to a mounting block or holder 22, which may be formed of plastic, and is fixedly secured by suitable means to the tube 21. The tube 21 defines a hollow cavity 23 rearwardly of the mounting block 22 and is provided with a removable end cap 24 for closing the rear end of the cavity 23.

Disposed within the cavity 23 is a tactile indication generator 25, which includes a generally cup-shaped holder 26 formed of a suitable material, such as plastic, and fixedly secured by suitable means to the inner surface of the tube 21. Received in the open end of the holder 26 is an electric motor 27 provided with an output shaft which projects inwardly toward the closed end of the holder 26 and has fixedly secured thereto a mass 28. The mass 28 may be formed of rubber and is disposed eccentrically of the motor shaft. The motor 27 is a DC motor and may be an 18-volt motor of the type sold by Mabuchi Motor Co. Ltd., under Model No. 2805. Because of its eccentric mounting, the mass 28 is unbalanced on the motor shaft and, therefore, will tend to vibrate the motor 27 and, thereby the holder 26 and the tube 21, as the motor shaft rotates.

Disposed in the cavity 23 rearwardly of the holder 26 is an appropriate battery 29 or a suitable battery pack. Disposed in the cavity 23 forwardly of the holder 26 is a circuit board 30, which carries the electronic circuitry of the torque wrench 10. The electronic circuitry may include suitable visual readout means (not shown) for giving visual indications of actual torque measurements and/or reference torque levels, in a known manner. It will be appreciated that suitable electrical connections, not fully illustrated, are formed among the battery 29, the motor 27, the circuit board 30 and the torque sensing assembly 17.

Referring now to FIG. 2, there is illustrated a control circuit 31 which is mounted on the circuit board 30 for controlling the operation of the motor 27. The control circuit 31 has an input terminal 32 which is coupled to the output of the torque sensing assembly 17 and receives therefrom an analog signal proportional to the torque level applied by the wrench 10. This input torque signal is applied to a subtracter circuit 35 which includes an integrated circuit ("IC") op amp 33 and associated resistors 34 and 36-38. The input terminal 32 is connected through the resistor 34 to the non-inverting input terminal of the op amp 33, which terminal is also connected through the resistor 36 to ground. The resistor 37 is connected between the output terminal and the inverting input terminal of the op amp 33, the inverting input terminal also being connected through the resistor 38 to the wiper of a potentiometer 39 which is connected between a +V supply voltage and ground.

The input terminal 32 is also connected to a differentiator circuit 40, which includes an IC op amp 41, a resistor 42 and a capacitor 43. The input terminal 32 is connected through the capacitor 43 to the inverting input terminal of the op amp 41, which input terminal is also connected through the resistor 42 to the output terminal of the op amp 41. The non-inverting input terminal of the op amp 41 is connected to ground.

The output terminals of the op amps 33 and 41 are, respectively, connected to the non-inverting and inverting input terminals of an IC op amp 45, the output of which is connected to the non-inverting input terminal of an IC op amp 46, the inverting input terminal of which is connected to ground. The output terminal of the op amp 46 is connected to the base of a field effect transistor ("FET") 47, which has its source connected to ground and its drain connected to one terminal of the motor 27, the other terminal of which is connected to the +V supply voltage.

Referring to FIG. 3, there is illustrated a power supply circuit 50 for the control circuit 31. The power supply 50 includes an IC voltage converter 51 and capacitors 52 and 53. The voltage converter 51 is connected across the terminals of the battery 29, with the positive terminal of the battery 29 providing the +V supply voltage. The converter 51 operates to convert the battery voltage to an opposite polarity −V output voltage for use by the IC op amp 33 of the control circuit 31.

Referring now also to FIG. 4, the operation of the control circuit 31 will be explained. Normally, the user of the torque wrench 10 would be alerted to cease applying torque when the applied torque level reaches the preset or reference level. However, depending upon the rate at which the torque is being applied, the actual peak torque applied would exceed the preset torque due to the reaction time of the operator. The present invention serves to correct for this over-torque condition.

The input torque signal from the torque sensing assembly 17 is applied to the subtracter circuit 35 and, more particularly, to the non-inverting input terminal of the op amp 33. The potentiometer 39 allows the operator to specify a preset torque level which is the desired torque to be applied by the wrench 10. A preset or reference signal is produced at the wiper of the potentiometer 39, which is applied to the inverting input terminal of the op amp 33 of the subtracter circuit 35. The subtracter circuit 35 operates to subtract the preset signal from the input torque signal to produce at the output of the op amp 33 a difference signal. In FIG. 4 there is illustrated a graph of voltage against time for a simplified case, wherein the rate of change of torque applied by the wrench 10 is constant. Thus, the input torque signal is a straight line 55, the value of which increases with time at a constant rate defined by the slope of the line 55. The preset or reference signal level is indicated by the line 56. It can be seen that the applied torque will reach the preset torque level at time $t_2$. The difference signal at the output of the op amp 33, which is the difference between the input signal 55 and the preset or reference signal 56, is indicated by the line 57, which signal becomes zero at time $t_2$ when the input signal 55 reaches the preset or reference level 56. This is when the indication signal would be generated in the absence of the compensation provided by the present invention.

The input torque signal is also applied to the differentiator circuit 40, which differentiates it to produce at the output of the op amp 41 a compensation signal, which is directly proportional to the rate of change of the input torque signal 55. Preferably, the values of the resistor 42 and the capacitor 43 are such that the difference signal is substantially equal to 0.1 seconds multiplied by the rate of change of the input torque signal in ft.-lbs./sec, this compensation factor being based on a typical operator response time. This compensation signal is indicated by the line 58 in FIG. 4. It will be appreciated that the compensation signal level could be changed by appropriate change of the values of the resistor 42 and the capacitor 43.

The difference signal 57 and the compensation signal 58 are, respectively, applied to the non-inverting and inverting input terminals of the op amp 45. If the inverting terminal of the op amp 45 were at ground potential, its output would go positive at the instant that the output of the op amp 33 went positive, i.e., at the instant that the input torque signal exceeded the preset or reference signal 56, i.e., at time $t_2$. However, with the output of the differentiator circuit 40 connected to the inverting input terminal of the op amp 45, the latter's output will go positive when the difference signal 57 at the output of the subtracter circuit 35 exceeds the compensation signal 58 at the output of the differentiator circuit 40, i.e., at time $t_1$, prior to time $t_2$.

When the output of the op amp 45 goes positive, this positive output is applied to the non-inverting input terminal of the op amp 46, driving its output positive to gate o the FET 47 and activate the motor 27 for generating the vibratory tactile indication to the user of the wrench 10. Thus, the user will receive a warning signal prior to the time that the torque applied reaches the preset or reference level, by a predetermined time period sufficient for the operator's reaction time to permit him to release the torque-applying force from the wrench 10 and prevent any overshoot of the preset or reference torque level.

It will be appreciated that, because the compensation signal is always a predetermined multiple (preferably 0.1) of the rate of change of the input torque signal, the difference between the predetermined torque level and the torque level at which the varying indication is triggered, i.e., the compensation torque level, will be directly proportional to the rate of change of the input torque signal, so that the faster torque is being applied, the lower will be the torque level at which the warning signal is triggered. Thus, referring to FIG. 4 for an input torque signal as indicated at 55', the difference signal would be 57' and the compensation signal, which corresponds to the compensation torque level, would be 58', which has a magnitude substantially greater than that of the compensation signal 58. It can be shown that the difference between compensation signal lines 58 and 58' is directly proportional to the difference between the slopes of the input signal lines 55 and 55'.

However, it can be shown that the predetermined warning or lead time period, i.e., the difference between $t_1$ and $t_2$, is independent of the rate of change of the input torque signal and will remain constant. In the example described above, the lead time would be 0.1 second. Thus, referring to FIG. 4, it can be seen that the input torque signal 55' reaches the reference or preset level at time $t_2'$ while the difference signal exceeds the compensation signal at time $t_1'$, such that the time period from $t_1'$ to $t_2'$ is the same as the time period from $t_1$ to $t_2$.

In a constructional model of the invention, the op amps 33, 41, 45 and 46 may all be sections of a multi-section op amp IC, such as an LM124A; the FET may be an IRFD113; and the IC voltage converter may be an ICL7660 made by Intersil.

From the foregoing, it can be seen that there has been provided an improved electronic torque wrench and an overshoot compensation circuit therefor which effectively provides advance warning to the user a predetermined time before the preset torque level is reached, so as to prevent overshoot thereof.

We claim:

1. An overshoot compensation circuit for providing an output signal before a time-varying input signal reaches a predetermined level, said circuit comprising: means establishing a reference signal corresponding to the predetermined level, means responsive to the input signal for producing a compensation signal which is a function of the rate of change of the input signal, and means responsive to the input signal and the reference signal and the compensation signal for producing the output signal a predetermined time period before the input signal reaches the predetermined level.

2. The circuit of claim 1, wherein said means for producing a compensation signal includes means for making the value of the compensation signal directly proportional to the rate of change of the input signal.

3. The circuit of claim 2, wherein the difference between the predetermined level and the level of the input signal at which the output signal is produced is directly proportional to the rate of change of the input signal.

4. The circuit of claim wherein said means for producing a compensation signal includes a differentiating circuit for differentiating the value of the input signal.

5. The circuit of claim and further comprising coupling means for coupling the output signal to associated circuitry.

6. The circuit of claim 1, wherein the input signal, and the reference signal and the compensation signal and the output signal are all electrical signals, each of said means including electronic circuit means.

7. The circuit of claim 1, wherein said means establishing a reference signal includes means for selectively varying the value of the reference signal.

8. An overshoot compensation circuit for providing an output signal before a time-varying input signal reaches a predetermined level, said circuit comprising: means establishing a reference signal corresponding to the predetermined level, means subtracting the reference signal from the input signal to produce a difference signal, means responsive to the input signal for producing a compensation signal which is a function of the rate of change of the input signal, and means comparing the difference signal to the compensation signal for producing the output signal when the value of the difference signal exceeds the value of the compensation signal.

9. The circuit of claim 8, wherein said means comparing includes means for comparing the absolute values of the difference signal and the compensation signal.

10. The circuit of claim 8, wherein said means for producing a compensation signal and said means comparing include operational amplifiers.

11. In a torque-applying apparatus including sensing means for producing a time-varying torque signal proportional to the torque being applied, and indicator means for producing an indication, the improvement comprising: means establishing a reference signal having a reference value corresponding to a predetermined torque level, means responsive to the torque signal for producing a compensation signal which is a function of the rate of change of the torque signal, and means coupled to said indicator means and responsive to the torque signal and the reference signal and the compensation signal for producing an output signal to activate said indicator means a predetermined time period before the torque signal reaches the reference value.

12. The apparats of claim 11, wherein said indicator means includes means for producing a tactile indication.

13. The apparatus of claim 12, wherein said indicator means includes a vibratory motor.

14. The apparatus of claim 13, and further comprising trigger means for actuating said motor.

15. The apparatus of claim 11, wherein the torque signal and the reference signal and the compensation signal and the output signal are all electrical signals, each of said means being an electronic circuit means.

16. The apparatus of claim 15, and further comprising a power supply coupled to each of said means for providing operating power thereto.

17. The apparatus of claim 11, wherein said means establishing a reference signal includes means for selectively varying the reference value.

18. The apparatus of claim 11, wherein said means producing an output signal includes means subtracting the reference value from the value of the torque signal to produce a difference signal, and means comparing the difference signal to the compensation signal for producing the output signal when the value of the difference signal exceeds the value of the compensation signal.

19. The apparatus of claim 11, wherein said means for producing a compensation signal includes a differentiating circuit.

20. The apparatus of claim 11, wherein the difference between the predetermined torque level and the torque level at which the output signal is produced is directly proportional to the rate of change of the value of the torque signal.

* * * * *

UNITED STATES PATENT AND TRADEMARK OFFICE
CERTIFICATE OF CORRECTION

PATENT NO. : 5,130,700
DATED : July 14, 1992
INVENTOR(S) : Jeffrey R. Annis et al.

It is certified that error appears in the above-identified patent and that said Letters Patent is hereby corrected as shown below:

Column 6, line 21, after "claim" insert --1,--; and line 24, after "claim" insert --1,--.

Signed and Sealed this

Fourteenth Day of September, 1993

Attest:

BRUCE LEHMAN

Attesting Officer

Commissioner of Patents and Trademarks